(12) United States Patent
Humphrey et al.

(10) Patent No.: US 6,476,486 B1
(45) Date of Patent: Nov. 5, 2002

(54) BALL GRID ARRAY PACKAGE WITH SUPPLEMENTAL ELECTRONIC COMPONENT

(75) Inventors: Tamio Humphrey, Corvallis, OR (US); Salvador Salcido, Jr., Albany, OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 563 days.

(21) Appl. No.: 09/087,130

(22) Filed: May 29, 1998

Related U.S. Application Data

(63) Continuation-in-part of application No. 08/960,735, filed on Oct. 30, 1997.

(51) Int. Cl.[7] .............................................. H01L 23/48
(52) U.S. Cl. ........................ 257/738; 257/772; 257/778; 257/781
(58) Field of Search ................................ 257/665, 737, 257/738, 772, 778, 780, 781

(56) References Cited

U.S. PATENT DOCUMENTS

| | | | |
|---|---|---|---|
| 5,103,283 A | * 4/1992 | Hite | 257/724 |
| 5,272,590 A | * 12/1993 | Hernandez | 361/306.2 |
| 5,311,057 A | * 5/1994 | McShane | 257/676 |
| 5,431,332 A | 7/1995 | Kirby et al. | 228/246 |
| 5,468,999 A | 11/1995 | Lin et al. | 257/784 |
| 5,640,047 A | 6/1997 | Nakashima | 257/738 |
| 5,640,048 A | 6/1997 | Selna | 257/738 |
| 5,729,053 A | * 3/1998 | Orthmann | 257/724 |
| 5,739,588 A | * 4/1998 | Ishida et al. | 257/782 |
| 5,787,575 A | * 8/1998 | Benerjee et al. | 257/713 |
| 5,795,799 A | * 8/1998 | Hosoya | 438/126 |
| 5,798,567 A | * 8/1998 | Kelly et al. | 257/778 |
| 5,811,880 A | * 9/1998 | Banerjee et al. | 257/724 |
| 5,818,699 A | * 10/1998 | Fukuoka | 257/724 |
| 5,831,810 A | * 11/1998 | Bird et al. | 361/301.1 |

* cited by examiner

*Primary Examiner*—Tom Thomas
*Assistant Examiner*—Ori Nadav

(57) ABSTRACT

A low inductance integrated circuit package such as a ball grid array package in which is provided a electronic device that enhances performance on an integrated circuit mounted in the die attachment region of the package. The electronic device may be either passive or active and may include such devices as sensors, Zener diodes, voltage regulators, chip based devices, etc. Provision of such devices in a ball grid array package creates a cost effective way of improving the performance on an integrated circuit mounted in that package.

14 Claims, 2 Drawing Sheets

BALL GRID ARRAY PACKAGE WITH SUPPLEMENTAL ELECTRONIC COMPONENT

CROSS-REFERENCED TO RELATED APPLICATIONS

The present application is a continuation in part of U.S. patent application Ser. No. 08/960,735, filed Oct. 30, 1997, by Tamio Humphrey and James C. Hudson and entitled Low Noise Ball Grid Array Package.

FIELD OF THE INVENTION

The present invention relates to ball grid arrays and more specifically to enhancing the performance of an integrated circuit mounted in a ball grid array.

BACKGROUND OF THE INVENTION

Ball grid arrays (BGA) and the like are a known type of integrated circuit package. A typical ball grid array includes a platform having a die attachment region provided thereon. The area in which the die attachment region is located is generally referred to as the cavity, while the peripheral area around the cavity is generally referred to as the border. A plurality of contact pads are usually placed towards the periphery of the cavity and these pads are connected by internal conductors to conductive "balls" on the backside (underside when mounted) of the platform. The conductive balls are normally arranged in a grid pattern, hence the name ball grid array, and provide a relatively low inductance electrical connection between the contact pads of the cavity and the traces of a printed circuit board or the like.

Ball grid arrays were developed as a mechanism that (1) facilitates efficient placement, interchangeability and test of integrated circuits and (2) reduces the parasitic lead inductance associated with prior integrated circuit to printed circuit board mountings. Perhaps as a result of this historical development, ball grid arrays are typically viewed merely as a package providing electrical conduits that distribute the pin out of an integrated circuit to appropriate locations on a printed circuit board. Electronic devices that enhance the performance of an integrated circuit, such as filters, regulators, sensors, protection and noise suppression circuits, etc., have conventionally been placed on the printed circuit board to which the integrated circuit and ball grid array are mounted or they are fabricated in the silicon (or other semiconductor material) of the integrated circuit. This practice, however, is disadvantageous in that it uses up valuable printed circuit board and/or integrated circuit real estate. In an effort to alleviate this problem (i.e., to conserve real estate), a designer may choose not to include the componentry, though this results in poorer circuit performance. A need thus exists to utilize ball grid arrays as more than a mere package of distributed conduits in which signal processing is not provided.

SUMMARY OF THE INVENTION

Accordingly, it is an object of the present invention to provide an integrated circuit package such as a ball grid array package that includes one or more supplemental electronic components that enhance the performance of an integrated circuit within the ball grid array package.

It is another object of the present invention to provide an integrated circuit package such as a ball grid array package that has a passive and/or active electronic device provided thereon or therein.

It is another object of the present invention to provide an integrated circuit package such as a ball grid array in which external components are placed close to the integrated circuit, thereby reducing parasitic affects and coupling noise, etc.

It is another object of the present invention to provide an integrated circuit package that affords a low cost, easily implemented manner of providing additional electronic functions inside of the package.

It is also an object of the present invention to provide an integrated circuit package that includes componentry previously placed on a printed circuit board to permit reduction of the size of the printed circuit board and the product in which the printed circuit board is mounted.

These and related objects of the present invention are achieved by use of a ball grid array package with supplemental electronic components as described herein.

In one embodiment, the present invention includes a low inductance integrated circuit package having a platform; a die attachment region formed on a first side of the platform; a plurality of low inductance mounting members form on a second substantially opposite side of the platform; and a supplemental electronic device provided on said first side of the platform that enhances performance on an integrated circuit in said die attachment region.

In another embodiment, the present invention includes a ball grid array apparatus having a platform with a cavity formed on a first side thereof; a die attachment region formed in said cavity; a plurality of low inductance balls formed on a second substantively opposite side of the platform; a ground and a power conductor provided adjacent said die attachment region; and an electronic device coupled to one of said contact pads and provided proximate said die attachment region.

The electronic device may be any passive or active device and may include a resistor, an inductor, a resistor-capacitor circuit, a resistor-capacitor-inductor circuit, an inductor-capacitor circuit, a diode, a Zener diode, and/or a capacitor. In addition the device may be a sensor, a voltage regulator, a chip based device or another electronic device. Provision of the device on a low inductance integrated circuit mounting package provides a cost effective manner of enhancing the performance of an integrated circuit provided in such a package.

A method of forming a low inductance integrated circuit package is also presented.

The attainment of the foregoing and related advantages and features of the invention should be more readily apparent to those skilled in the art, after review of the following more detailed description of the invention taken together with the drawings.

DETAILED DESCRIPTION

Figure 1:
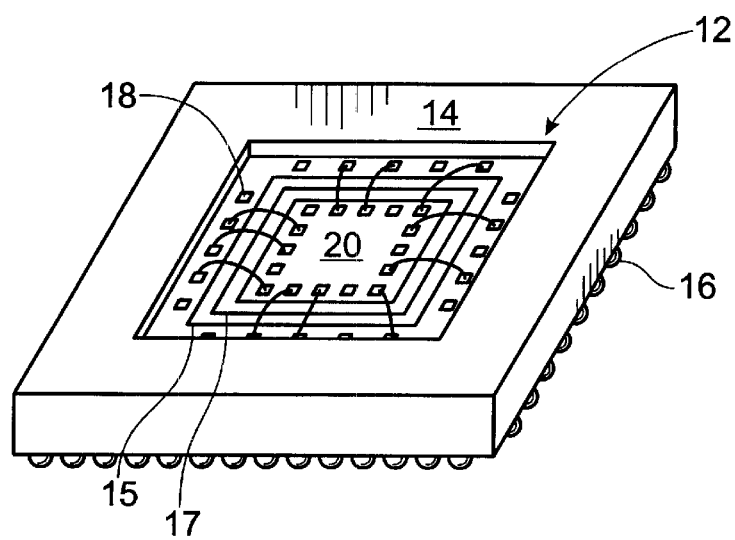
FIG. 1 is a perspective view of a low inductance integrated circuit mounting package or a ball grid array in accordance with the present invention.

Referring to FIG. 1, a perspective view of a low inductance integrated circuit mounting package or a ball grid array 10 in accordance with the present invention is shown. Ball grid arrays are normally made of plastic or ceramic or other suitable material as is known. Ball grid array 10 is preferably made of plastic to facilitate the low cost production of integrated circuit packaging. The use of supplemental electronic components as discussed herein in combination with a low cost package achieves a low cost manner of improving circuit performance.

Ball grid array 10 includes a die attachment region or cavity 12, which is preferably surrounded by a border 14. A plurality of conductive balls 16 are provided on a mounting surface of the ball grid array and these balls are connected through internal conductors to exposed contact pads 18 in cavity 12. An integrated circuit 20 is mounted within cavity 12 using known mounting techniques and a ground ring 15 and a power ring 17 or the like are typically provided around the integrated circuit for delivery of these signals to the circuit. The ground and power rings may be partial, fragmented or complete. A plurality of contact pads 21 (labeled in FIG. 8) are shown around the periphery of integrated circuit 20. These pads are preferably connected to contact pads 18 of the ball grid array and to the supplemental electronic components (discussed below) by wire leads. To reduce crowding in FIG. 1, less than the conventional number of contact pad and wire leads are shown and the leads and contact pads 21 are not labeled.

As discussed in more detail below with reference to FIGS. 2–8, one or more circuit components are provided on ball grid array 10, preferably within cavity 12, to enhance the performance of integrated circuit 20. It is to be understood that the components of FIGS. 2–8 are implemented in cavity 12 of ball grid array 10 of FIG. 1.

Figure 2:
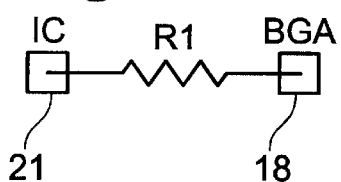
FIGS. 2–7 are schematic diagrams of supplemental electronic componentry that may be provided in the low inductance integrated circuit mounting package or ball grid array of FIG. 1 in accordance with the present invention.

Referring to FIG. 2, a schematic diagram of a supplemental resistor R1 provided in an integrated circuit package such as a ball grid array package in accordance with the present invention is shown. Resistor R1 is preferably any of a type of known resistive elements including chip resistors, conductive strip resistors, etc. Resistor R1 is coupled between a contact pad 18 of the ball grid array and contact pad 21 of the integrated circuit.

Figure 3:
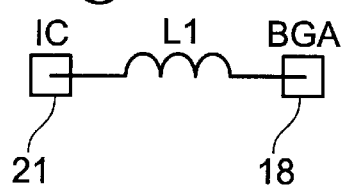

Referring to FIG. 3, a schematic diagram of a 30 supplemental inductor L1 provided in an integrated circuit package such as a ball grid array package in accordance with the present invention is shown. Inductor L1 is preferably any of a type of known surface mount inductors or the like and is coupled between a ball grid array contact pad 18 and an integrated circuit pad 21.

Figure 4:
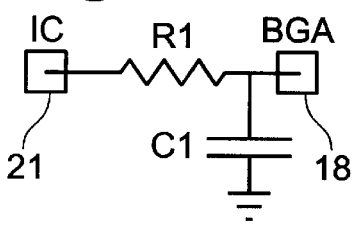

Referring to FIG. 4, a schematic diagram of a supplemental resistor-capacitor circuit provided in an integrated circuit package such as a ball grid array package in accordance with the present invention is shown. The resistor-capacitor circuit may function as a filter circuit and may be comprised of discreet components R1,C1 or provided as a chip RC circuit (RC1 of FIG. 8), etc.

Figure 5:
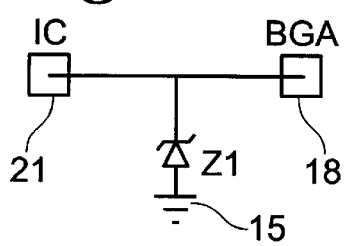

Referring to FIG. 5, a schematic diagram of a supplemental signal line coupled Zener diode Z1 provided in an integrated circuit package such as a ball grid array package in accordance with the present invention is shown. Zener diode Z1 provides signal line noise suppression or reduction and is preferably coupled to a signal line between contact pads 18,21 in such a manner as to shunt over currents in that signal line to ground. Suitable surface mount Zener diodes or the like or related noise suppression devices are known in the art.

Figure 6:
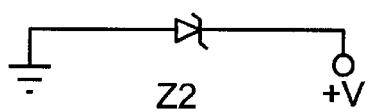

Referring to FIG. 6, a schematic diagram of a supplemental power conductor Zener diode Z2 provided in an integrated circuit package such as a ball grid array package in accordance with the present invention is shown. Zener diode Z2 or like components provide noise suppression or reduction in the power conductor and function by shunting overcurrents in the power supply network to ground. Zener diode Z2 is preferably coupled between the power and ground rings 17,15.

Figure 7:
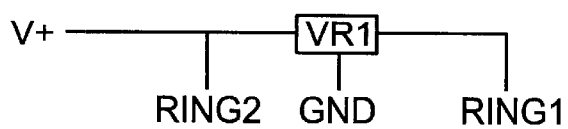

Referring to FIG. 7, a schematic diagram of a supplemental voltage regulator provided in an integrated circuit package such as a ball grid array package in accordance with the present invention is shown. Voltage regulator VR1 is preferably provided between the power supply conductor(s) and ground. Suitable voltage regulators and the like are known in the art.

Figure 8:
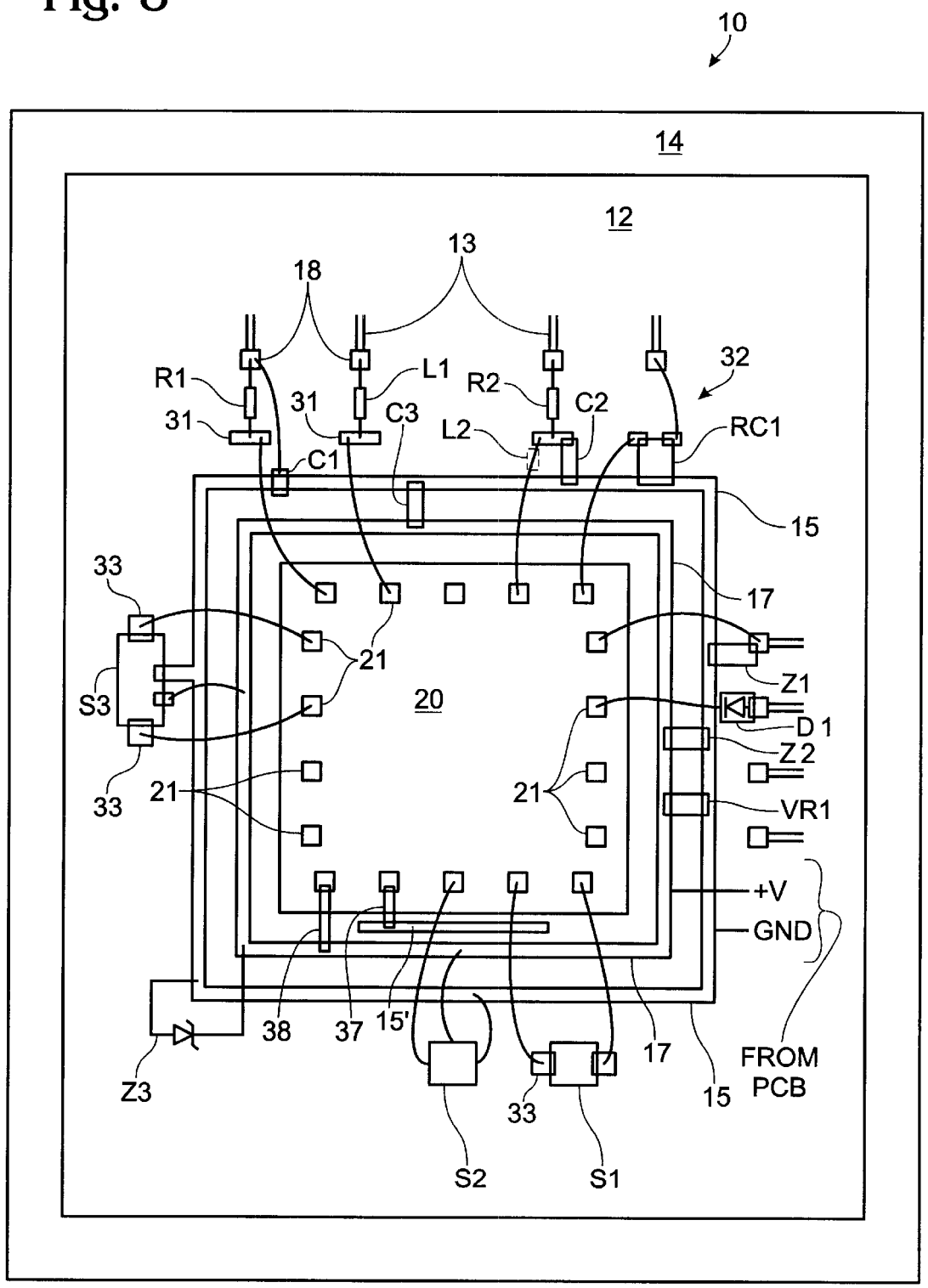
FIG. 8 is a plan view of the low inductance integrated circuit mounting package or ball grid array of FIG. 1 that illustrates supplemental electronic components provided therewith.

Referring to FIG. 8, a plan view of a low inductance integrated circuit. mounting package or a ball grid array package having supplemental electronic components in accordance with the present invention is shown. Several of the features or elements shown in FIG. 1 are shown in FIG. 8. These include cavity 12, border 14, ground ring 15, power ring 17, contact pads 18 and integrated circuit 20.

A plurality of conductive traces 13 are shown coupled to contact pads 18. These are exposed portions of the internal conductors that connect conductive balls 16 (FIG. 1) to contact pads 18. Ball grid array 10 may also contain internal conductors that are wholly unexposed (connecting through vias to the underside of a contact pad 18).

As alluded to above, the present invention includes providing components on or within ball grid array 10 that enhance circuit performance. The components may perform functions related to filtering, noise suppression, signal generation or other. While the components may be added within the ball grid array during fabrication, in a preferred embodiment the components are mounted in or near the exposed cavity region after initial BGA formation. Such a practice provides many benefits including, but not limited to, formation of non-custom ball grid array packages, reduced ball grid array fabrication costs, ease of access to components and their placement locations and interchangeability of components, etc. The components may be active and/or passive as discussed in more detail below and may be provided as discreet devices or within integrated circuits or "chips". The components are preferably surface mounted using standard surface mount assembly techniques. Several representative components and representative arrangements are now discussed. The representative examples are intended to be illustrative of various embodiments of the present invention and to be in no way limiting. It would be evident to one skilled in the art to utilize other types of components in or on a ball grid array to achieve a desired signal processing given the teachings herein.

Referring more specifically to the upper left hand corner of FIG. 8, an implementation of R1 (of FIG. 2 or FIG. 4) is shown. R1 is coupled between a contact pad 18 and a supplemental contact pad 31. The supplemental contact pad is coupled to a contact pad 21 of the integrated circuit. Supplemental contact pads (31,32,33) are essentially conductive areas formed on an exposed surface of the ball grid array and may be provided in a uniform or non-uniform pattern. The supplemental contact pads provide additional surfaces for mounting some of the supplemental electronic components discussed herein.

Capacitor C1 is shown coupled to (i.e., mounted on) ground ring 15 and the same contact pad 18 to which R1 is connected. The arrangement of C1 is this manner forms the resistor-capacitor circuit of FIG. 4.

Inductor L1 is shown coupled between a contact pad 18 and a supplemental contact pad 31 that is in turn coupled to a contact pad of the integrated circuit. A capacitor C3 is shown coupled between the ground and power rings 15,17 for EMI suppression.

Components R2,L2,C2 form a RLC filter circuit. The inductor may be a surface mount device or the like or an inherent characteristic of the wire lead that connects between the supplemental contact pad and the integrated circuit. Capacitor C2 is shown coupled between the supplemental contact pad and the ground ring as opposed to being mounted on the ground ring like C1.

RC1 represents a chip RC circuit. If desired the chip of RC1 could be fabricated to include an inductor or another arrangement of devices. A paired supplemental contact pad 32 is provided to signal line input and output. Chip RC1 is also coupled to the ground ring.

Zener diode Z1 is coupled between a contact pad 18 of the ball grid array and a contact pad 21 of the integrated circuit. Z1 provides signal line noise suppression.

Zener diode Z2 is provided between the ground and power conductors 15,17 and provides a similar function. A voltage regulator VR1 may also be provided between the ground and power conductors.

S1, S2 and S3 represent sensors. Sensor S1 is coupled to random supplemental contact pads 31 and between first and second signal lines (e.g., input and output) of integrated circuit 20. Sensor S2 receives power and ground and outputs a signal to the integrated circuit. Sensor S3 is coupled between a first and a second signal and receives power and ground.

Sensors S1–S3 may be temperature, light, current or voltage or other types of sensors or the like and may function as stand alone units or in combination with other known circuit components, not shown. The sensors preferably provide information related to integrated circuit performance. For example, sensor 56 may be a temperature sensor and logic within integrated circuit 20 may be programmed to operate at a reduced power mode when sensor 56 indicates a temperature that is above a predetermined threshold.

Sensors S1–S3 are presented as examples of the present invention. It should be recognized that the components indicated as S1–S3 could alternatively be another electronic, electromechanical or electromagnetic device including an integrated circuit performing a non-sensing function, etc. Placement of various components including smaller surface mount integrated circuits and/or other devices within a ball grid array package permits the formation of low cost packages with enhanced circuit performance.

In normal use, integrated circuit 20 typically has many more contact pads 21 than those shown. These contact pads are connected by wire lead lines to contact pads 18 of the ball grid array and to the ground and power conductors as appropriate. Due to the presence of these wire lead lines, the arrangement or placement of the various supplemental components discussed herein must accommodate requisite lead line connections. Hence, the provision of supplemental components near the corners or other regions of the cavity in which they do not interfere with connecting lead lines is preferred. Zener diode Z3 is shown in the lower left-hand corner.

FIG. 8 also illustrates a supplemental ground conductor 15' and an electronic device 37 coupled between that conductor and a contact pad 21. An electronic device 38 is also shown between power conductor 15 and a contact pad 21. Electronic devices 37,38 may be pull up or pull down resistors or capacitors or any other suitable electronic device. A representative diode D1 is also illustrated in FIG. 8. The diode may be coupled within a signal line or otherwise as known in the art.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A low inductance integrated circuit package, comprising:
   a platform having a first side and a second side, said second side being disposed generally opposite said first side;
   a cavity region formed on said first side of said platform, said cavity being substantially surrounded by a border region and including a die attachment region positioned therein;
   a plurality of contact pads provided at said cavity region for coupling to an integrated circuit provided at said die attachment region;
   a plurality of low inductance mounting members for electrically mounting said platform, each of said low inductance mounting members being coupled to one of said plurality of contact pads via internal conductors;
   a power conductor provided at said cavity region proximate said die attachment region and coupled to at least one of said low inductance mounting members, said power conductor being provided on substantially all horizontally disposed sides of said die attachment region;
   a ground conductor provided at said cavity region proximate said die attachment region and coupled to at least one of said low inductance mounting members, said ground conductor being provided on substantially all horizontally disposed sides of said die attachment region; and
   a supplemental electronic device provided at said cavity region at least in part between said die attachment region and said border region that enhances performance on an integrated circuit in said die attachment region, said supplemental electronic device includes one or more of the group of electronic devices including:
   a resistor;
   an inductor;
   a resistor-capacitor circuit;
   a resistor-capacitor-inductor circuit;
   an inductor-capacitor circuit;
   a sensor;
   a diode;
   a Zener diode; and
   an active device.

2. The integrated circuit mounting package of claim 1, wherein said power and ground conductors are provided in a substantially parallel relationship with one another at said cavity region.

3. The integrated circuit mounting package of claim 1, further comprising an integrated circuit mounted at said die attachment region and wherein said supplemental electronic device is a sensor that functions in conjunction with said mounted integrated circuit.

4. The integrated circuit mounting package of claim 1, wherein said supplemental electronic device is provided in an integrated circuit.

5. The integrated circuit mounting package of claim 1, wherein said supplemental electronic device is coupled at said cavity region to at least one of said power and ground conductors.

6. The integrated circuit mounting package of claim 1, wherein said low inductance mounting members are provided on said second side of said platform.

7. The integrated circuit mounting package of claim 1, wherein said cavity is recessed.

8. A low inductance integrated circuit package apparatus, comprising:
   a platform having a first side and a second side, said second side being disposed generally opposite said first side;
   a die attachment region formed on said first side of said platform;
   a plurality of contact pads provided about said die attachment region for coupling to an integrated circuit provided at said die attachment region;
   a plurality of low inductance mounting members formed on said platform, each coupled by an internal conductor to one of said plurality of contact pads;
   a power conductor provided on said first side of said platform and on substantially all horizontally disposed sides of said die attachment region;
   a ground conductor provided on said first side of said platform and on substantially all horizontally disposed sides of said die attachment region; and
   an electronic device coupled to one of said contact pads and provided adjacent said die attachment region, said electronic device provided to enhance performance on an integrated circuit mounted at said die attachment region, said electronic device includes including or more of the group of electronic devices including:
   a resistor;
   an inductor;
   a resistor-capacitor circuit;
   a resistor-capacitor-inductor circuit;
   an inductor-capacitor circuit;
   a sensor;
   a diode;
   a Zener diode; and
   an active device.

9. The apparatus of claim 8, wherein said die attachment region is surrounded by a border region formed towards the periphery of the platform and said electronic device is provided proximate said die attachment region substantially between said die attachment region and said border region.

10. The apparatus of claim 8, wherein said electronic device is a sensor that functions in conjunction with an integrated circuit provided in said die attachment region.

11. The apparatus of claim 1, wherein said electronic device is provided in an integrated circuit.

12. The apparatus of claim 1, wherein said low inductance mounting members are provided on said second side of said platform.

13. The apparatus of claim 8, wherein said electronic device is coupled to at least one of said power and ground conductors.

14. The apparatus of claim 8, wherein said power and ground conductors are arranged in a substantially parallel manner about said die attachment region.

* * * * *